(12) United States Patent
Nihtianov et al.

(10) Patent No.: US 10,508,896 B2
(45) Date of Patent: Dec. 17, 2019

(54) MEASUREMENT SUBSTRATE AND A MEASUREMENT METHOD

(71) Applicant: ASML NETHERLANDS B.V., Veldhoven (NL)

(72) Inventors: Stoyan Nihtianov, Eindhoven (NL); Ruud Hendrikus Martinus Johannes Bloks, Helmond (NL); Johannes Paul Marie De La Rosette, Venlo (NL); Thibault Simon Mathieu Laurent, Eindhoven (NL); Kofi Afolabi Anthony Makinwa, Delft (NL); Patricius Jacobus Neefs, Raamsdonksveer (NL); Johannes Petrus Martinus Bernardus Vermeulen, Leende (NL)

(73) Assignee: ASML Netherlands B.V., Veldhoven (NL)

( * ) Notice: Subject to any disclaimer, the term of this patent is extended or adjusted under 35 U.S.C. 154(b) by 37 days.

(21) Appl. No.: 15/778,061

(22) PCT Filed: Nov. 23, 2016

(86) PCT No.: PCT/EP2016/078545
§ 371 (c)(1),
(2) Date: May 22, 2018

(87) PCT Pub. No.: WO2017/089391
PCT Pub. Date: Jun. 1, 2017

(65) Prior Publication Data
US 2018/0340767 A1    Nov. 29, 2018

(30) Foreign Application Priority Data
Nov. 25, 2015   (EP) .................................. 15196359

(51) Int. Cl.
    *G01B 7/00*      (2006.01)
    *G01B 7/16*      (2006.01)
    (Continued)

(52) U.S. Cl.
    CPC ................. *G01B 7/20* (2013.01); *G01K 7/01* (2013.01); *G03F 7/7085* (2013.01);
    (Continued)

(58) Field of Classification Search
    CPC ........ G01B 7/20; G01K 7/01; G03F 7/70625; G03F 7/7085; G03F 7/70866;
    (Continued)

(56) References Cited

U.S. PATENT DOCUMENTS 5,233,191 A * 8/1993 Noguchi ................. H04L 22/20
    250/307
7,906,032 B2 * 3/2011 Yamashita ................ B08B 7/00
    118/715

(Continued)

FOREIGN PATENT DOCUMENTS

| | | |
|---|---|---|
| EP | 1420298 A2 | 5/2004 |
| TW | 201212099 A | 3/2012 |
| WO | 2017008993 A1 | 1/2017 |

OTHER PUBLICATIONS

Written Opinion of the International Searching Authority International Application No. PCT/EP2016/078545 dated Mar. 9, 2017.

(Continued)

*Primary Examiner* — Max H Noori
(74) *Attorney, Agent, or Firm* — Pillsbury Winthrop Shaw Pittman LLP

(57) ABSTRACT

A measurement substrate for measuring a condition pertaining in an apparatus for processing production substrates during operation thereof, the measurement substrate including: a body having dimensions compatible with the appa- (Continued)

ratus; a plurality of sensor modules embedded in the body, each sensor module having: a sensor configured generate an analog measurement signal, an analog to digital converter to generate digital measurement information from the analog measurement signal, and a module controller configured to output the digital measurement information; and a central control module configured to receive the digital measurement information from each of the module controllers and to communicate the digital measurement information to an external device.

21 Claims, 6 Drawing Sheets

(51) Int. Cl.
*G03F 7/20* (2006.01)
*H01L 21/67* (2006.01)
*G01K 7/01* (2006.01)
*H01L 21/66* (2006.01)

(52) U.S. Cl.
CPC ...... *G03F 7/70625* (2013.01); *G03F 7/70866* (2013.01); *G03F 7/70875* (2013.01); *H01L 21/67248* (2013.01); *H01L 21/67276* (2013.01); *H01L 22/34* (2013.01)

(58) Field of Classification Search
CPC .......... G03F 7/70875; H01L 21/67248; H01L 21/67276; H01L 22/34
USPC .......................................................... 73/767
See application file for complete search history.

(56) References Cited

U.S. PATENT DOCUMENTS

| | | | |
|---|---|---|---|
| 10,012,980 B2* | 7/2018 | Mizutani | G05B 19/4189 |
| 2004/0007326 A1 | 1/2004 | Roche et al. | |
| 2004/0207824 A1 | 10/2004 | Lof et al. | |
| 2005/0284570 A1 | 12/2005 | Doran et al. | |
| 2006/0138307 A1 | 6/2006 | Vreede et al. | |
| 2006/0234398 A1 | 10/2006 | Gluschenkov et al. | |
| 2007/0146668 A1* | 6/2007 | Geh | G03F 7/70425 |
| | | | 355/53 |
| 2009/0059217 A1 | 3/2009 | Okita | |
| 2011/0174777 A1 | 7/2011 | Jensen et al. | |
| 2013/0029433 A1 | 1/2013 | Sun et al. | |

OTHER PUBLICATIONS

International Search Report International Application No. PCT/EP2016/078545 dated Mar. 9, 2017.
Office Action issued in corresponding Taiwanese Patent Application No. 105138855 dated Jul. 6, 2017 with English translation.

* cited by examiner

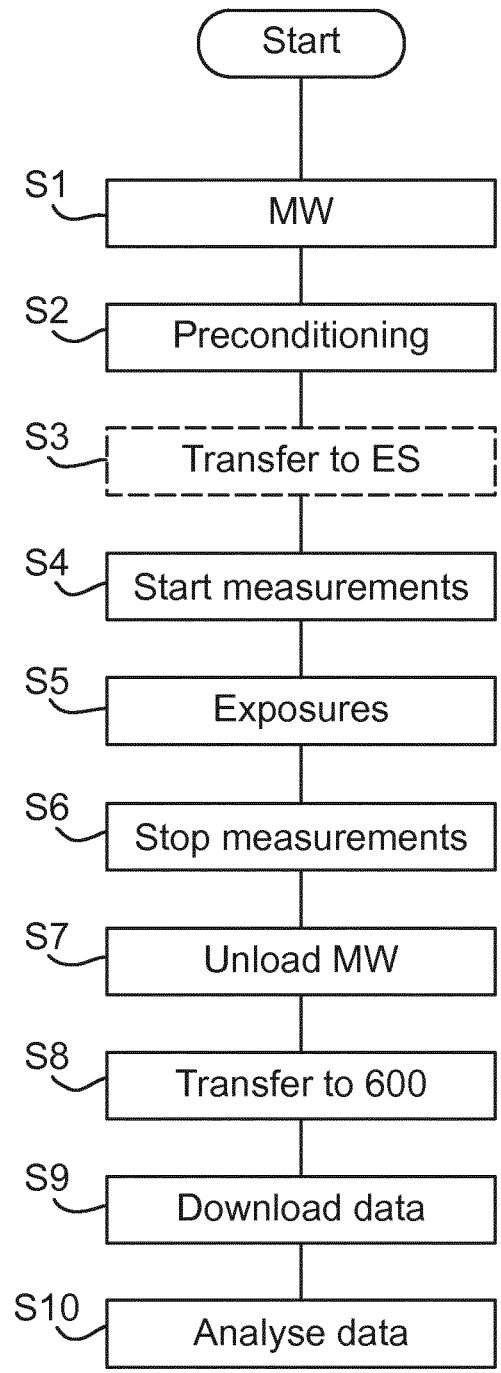

MEASUREMENT SUBSTRATE AND A MEASUREMENT METHOD

CROSS-REFERENCE TO RELATED APPLICATIONS

This application is the U.S. national phase entry of PCT patent application no. PCT/EP2016/078545, which was filed on Nov. 23, 2016, which claims the benefit of priority of European patent application no. 15196359.2, which was filed on Nov. 25, 2015, and which is incorporated herein in its entirety by reference.

FIELD

The present invention relates to a measurement substrate and a measurement method for use in a lithographic apparatus, a metrology apparatus or a process apparatus, for example.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Immersion techniques have been introduced into lithographic systems to enable improved resolution of smaller features. In an immersion lithographic apparatus, a liquid layer of a liquid having a relatively high refractive index is interposed in a space between a projection system of the apparatus (through which the patterned beam is projected towards the substrate) and the substrate. The liquid covers at last the part of the wafer under the final lens element of the projection system. Thus, at least the portion of the substrate undergoing exposure is immersed in the liquid. The effect of the immersion liquid is to enable imaging of smaller features since the exposure radiation will have a shorter wavelength in the liquid than gas. (The effect of the liquid may also be regarded as increasing the effective numerical aperture (NA) of the system and also increasing the depth of focus.)

In commercial immersion lithography, the liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space as immersion liquid. Other liquids with a high refractive index can be used besides water can be used as the immersion liquid, for example: a hydrocarbon, such as a fluorohydrocarbon; and/or an aqueous solution. Further, other fluids besides liquid have been envisaged for use in immersion lithography.

In this specification, reference will be made in the description to localized immersion in which the immersion liquid is confined, in use, to the space between the final lens element and a surface facing the final element. The facing surface is a surface of substrate or a surface of the supporting stage (or substrate table) that is co-planar with the substrate surface. (Please note that reference in the following text to surface of the substrate W also refers in addition or in the alternative to a surface of the substrate table, unless expressly stated otherwise; and vice versa). A fluid handling structure present between the projection system and the stage is used to confine the immersion to the immersion space. The space filled by liquid is smaller in plan than the top surface of the substrate and the space remains substantially stationary relative to the projection system while the substrate and substrate stage move underneath. Other immersion systems have been envisaged such as an unconfined immersion system (a so-called 'All Wet' immersion system) and a bath immersion system.

An alternative to immersion lithography is EUV lithography, in which the radiation beam is formed of EUV radiation, e.g. having a wavelength in the range of from 5 nm to 20 nm. EUV radiation can be generated by a plasma source or a free-electron laser, for example. In EUV lithography, the beam path, including the mask and substrate, are kept in a near-vacuum and reflective optical elements are mostly used. This is because EUV radiation is strongly absorbed by most materials. A low pressure of hydrogen gas may be present, e.g. to assist in cleaning contaminants when a plasma source is used.

When a substrate is exposed in a lithographic apparatus, energy from the projection beam is absorbed by the substrate and therefore the substrate heats up. The heating is local to the target portion being exposed and therefore any thermal expansion of the substrate due to the heating can lead to distortion of the substrate. Substrate distortion can lead to overlay errors, for example between successive layers, or even exposures of the same area when multiple patterning techniques (using multiple exposures) are used to expose a single layer. The heating that may occur depends on a number of factors. These factors may include (in a non-limited list) the duration of an exposures such as for a whole substrate or of a single scan, details of the photo-sensitive layer and, in an immersion-type lithographic apparatus, the flow rate of immersion liquid during the exposure. In an EUV lithographic apparatus the problem of local heating can be particularly acute because the near-vacuum environment conducts less heat from the substrate than does the immersion liquid in an immersion-type lithographic apparatus. Flows of such gases as are present in an EUV lithographic apparatus do however affect the conduction of heat from the substrate. It is therefore difficult to predict the nature and magnitude of any distortion of a substrate that may occur when it is exposed. The distortion has therefore been determined empirically, by measuring overlay errors in test exposures. However, with such an approach it is difficult to separate overlay errors caused by thermal distortion of the substrate from overlay errors deriving from other causes.

A thermal test substrate (or wafer) supplied by KLA-Tencor of Milpitas, Calif. is known. This thermal test substrate includes about 10 to 100 negative temperature coefficient temperature sensors. The temperature sensors are fixed at various points in a 300 mm silicon wafer. The temperature sensors are connected to readout electronics located centrally in the substrate. The thermal test substrate has the approximate dimensions of a production wafer. The thermal test substrate is processed through a lithographic apparatus as if it were a production substrate. The thermal test substrate records the temperature recorded by the negative temperature coefficient temperature sensors periodically. However, this thermal test substrate does not provide enough accurate information to satisfy increasingly strict limits on overlay errors imposed by the desire to image patterns of smaller critical dimension.

SUMMARY

It is desirable, for example, to provide means to enable accurate measurements of conditions prevailing within a lithographic apparatus whilst it is operating.

According to an aspect of the invention, there is provided a measurement substrate for measuring a condition pertaining in an apparatus for processing production substrates during operation thereof, the measurement substrate comprising:

a body having dimensions similar to that of a production substrate so that the measurement substrate is compatible with the apparatus;

a plurality of sensor modules in the body, each sensor module comprising:

a sensor configured to generate an analog measurement signal, the sensor comprising at least a temperature sensor or a strain sensor;

an analog to digital converter configured to generate digital measurement information from the analog measurement signal; and a module controller configured to output the digital measurement information; and a central control module configured to receive the digital measurement information from each of the module controllers and to communicate the digital measurement information to an external device.

According to an aspect of the invention, there is provided a method of measuring conditions in an apparatus for processing production substrates, the method comprising:

loading into the apparatus a measurement substrate having dimensions similar to that of a production substrate so that the measurement substrate is compatible with the apparatus, the measurement substrate having a central control module and plurality of sensor modules, each sensor module comprising a sensor and an analog to digital converter, the sensor comprising at least a temperature sensor or a strain sensor;

operating the sensor to generate an analog measurement signal;

using the analog to digital converter to convert the analog measurement signal to digital measurement information;

transferring the digital measurement information to the central control module; and outputting the digital measurement information from the central control module to an external device

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 11 is a flow diagram of a measurement method according to an embodiment.

DETAILED DESCRIPTION

Figure 1:
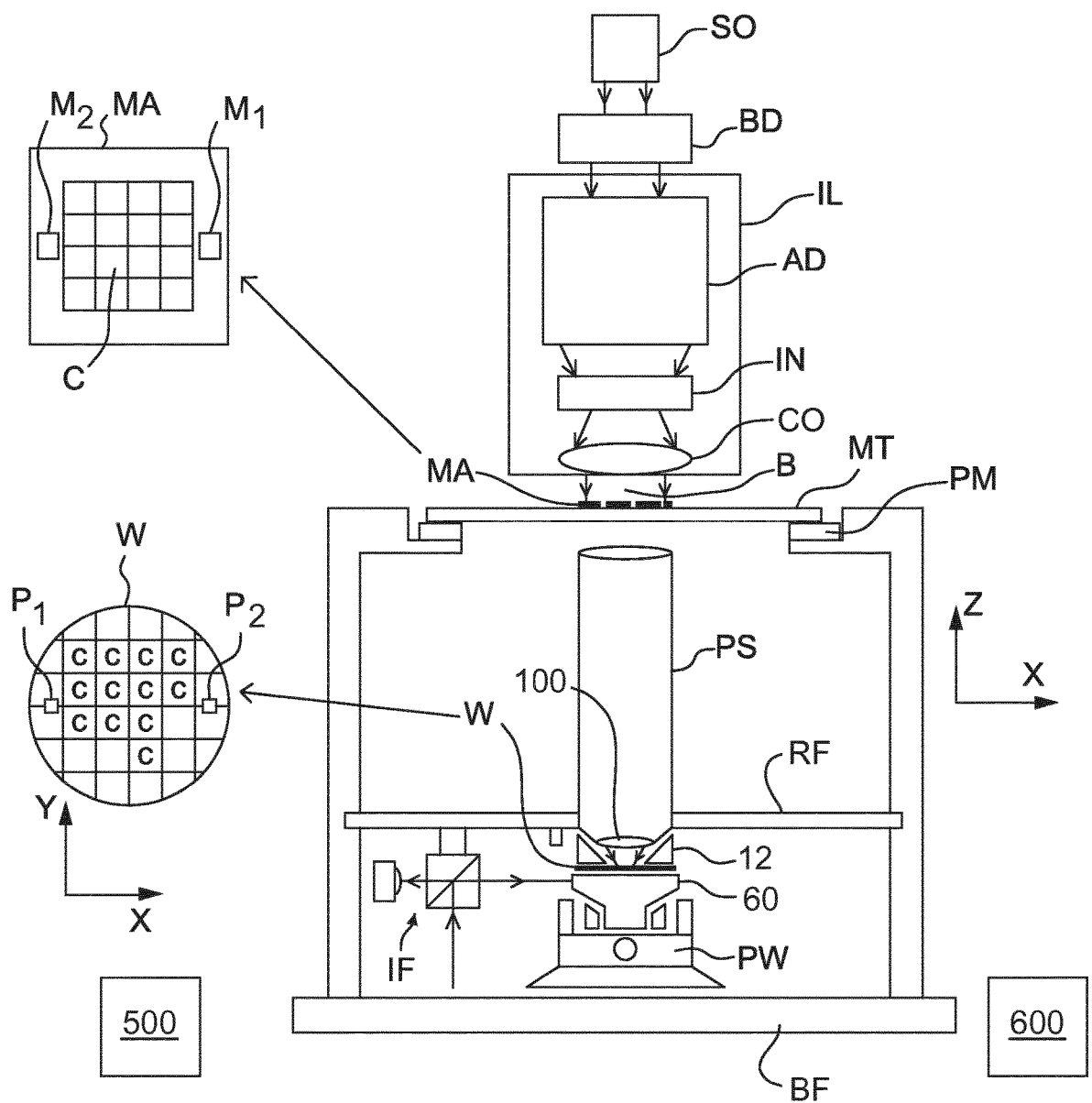
FIG. 1 schematically depicts a lithographic apparatus.

FIG. 1 schematically depicts a lithographic apparatus in which an embodiment of the invention can be used. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan.

In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

A download station 600, described further below, is provided as part of the lithographic apparatus or as a separate device elsewhere in the fab, perhaps close to the lithographic apparatus or at a central location. The download station is connected to controller 500, a supervisory control system and/or the overall control system of the fab. The download station can incorporate a computer system programmed to analyze the information obtained from the inspection substrate, or such analysis can be performed elsewhere.

Arrangements for providing liquid between a final lens element of the projection system PS and the substrate can be classed into three general categories. These are the bath type arrangement, the so-called localized immersion systems and the all-wet immersion systems. The present invention relates particularly to the localized immersion systems.

In an arrangement which has been proposed for a localized immersion system, a liquid confinement structure 12 extends along at least a part of a boundary of an immersion space between the final lens element of the projection system PS and the facing surface of the stage or table facing the projection system. The facing surface of the table is referred to as such because the table is moved during use and is rarely stationary. Generally, the facing surface of the table is a surface of a substrate W, substrate table WT which surrounds the substrate or both.

In an embodiment, the liquid confinement structure 12 as illustrated in FIG. 1 may extend along at least a part of a boundary of the immersion space between the final lens element 100 of the projection system PS and the substrate table WT or substrate W. In an embodiment, a seal is formed between the liquid confinement structure 12 and the surface of the substrate W/substrate table WT. The seal may be a contactless seal such as a gas seal 16 or an immersion liquid seal. (A system with a gas seal is disclosed in European patent application publication no. EP-A-1,420,298 which is hereby incorporated by reference in its entirety).

The liquid confinement structure 12 is configured to supply and confine immersion liquid to the immersion space. Liquid may be brought into the immersion space by a liquid inlet and the liquid may be removed by a liquid outlet.

The liquid may be confined in the immersion space by a gas seal. In use the gas seal is formed between the bottom of the liquid confinement structure 12 and the facing surface of the table (i.e. the surface of the substrate W and/or the surface of the substrate table WT). The gas in the gas seal is provided under pressure via an inlet to a gap between the liquid confinement structure 12 and substrate W and/or substrate table WT. The gas is extracted via a channel associated with an outlet. The overpressure on the gas inlet, vacuum level on the outlet and geometry of the gap are arranged so that there is a high-velocity gas flow inwardly that confines the liquid. The force of the gas on the liquid between the liquid confinement structure 12 and the substrate W and/or substrate table WT confines the liquid in the immersion space 10. Such a system is disclosed in United States patent application publication no. US 2004-0207824 which is hereby incorporated by reference in its entirety.

Figure 3:
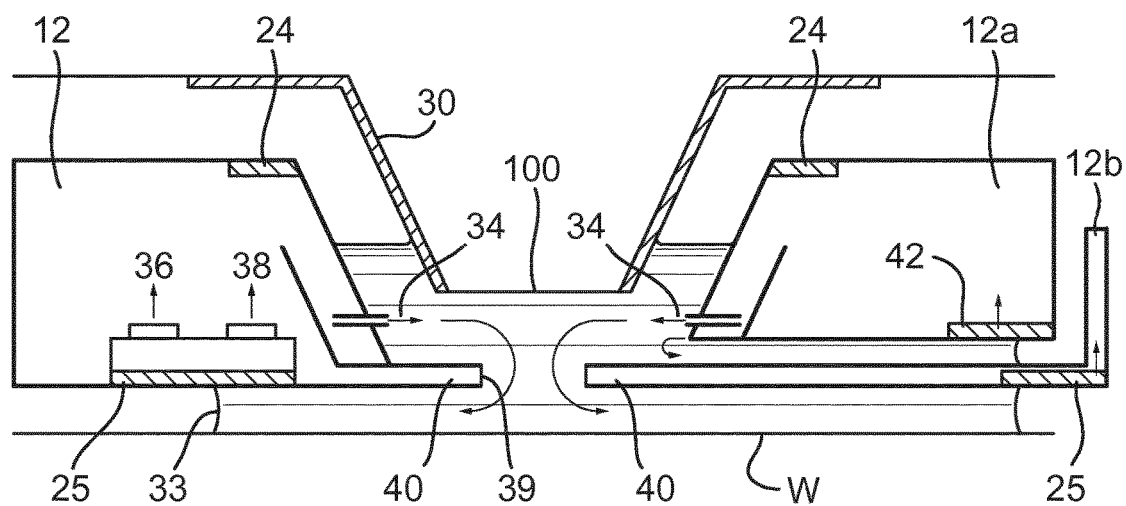
FIG. 3 is a side cross sectional view that schematically depicts a two further immersion liquid confinement structure arrangements for use in a lithographic projection apparatus.

Other immersion liquid confinement structures 12 can be used with embodiments of the present invention, such the arrangement depicted in FIG. 3.

Figure 2:
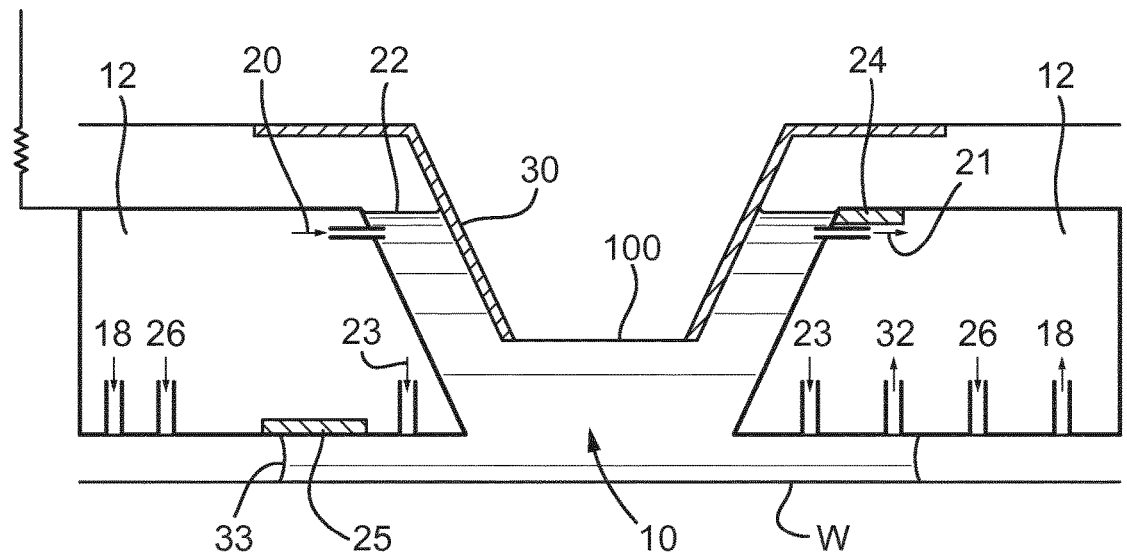
FIG. 2 schematically depicts two immersion liquid confinement structure arrangements for use in a lithographic projection apparatus.

FIGS. 2 and 3 show different features which may be present in variations of the liquid confinement structure 12. The arrangements illustrated in FIG. 2 and described below may be applied to the lithographic apparatus described above and illustrated in FIG. 1. The two different arrangements are shown for features on the bottom left-hand-side and bottom right-hand side of the figure, respectively. Unless mentioned otherwise, the two designs share common features. The designs may share some of the same features as described above unless described differently. The features described herein may be selected individually or in combination as shown or as required.

FIG. 2 shows a confinement structure 12 around the bottom surface of a last lens element. The last lens element 100 has an inverted frustro-conical shape. The frustro-conical shape having a planar bottom surface and a conical surface. The frustro-conical shape protrudes from a planar surface and having a bottom planar surface. The bottom planar surface is the optically active portion of the bottom surface of the last lens element, through which the projection beam may pass. The confinement structure surrounds at least part of the frustro-conical shape. The confinement structure has an inner-surface which faces towards the conical surface of the frustro-conical shape. The inner-surface and the conical surface have complementary shape. A top surface of the confinement structure is substantially planar.

The confinement structure may fit around the frustro-conical shape of the last lens element. A bottom surface of the liquid confinement structure is substantially planar and in use the bottom surface may be parallel with the facing surface of the table and/or wafer. The distance between the bottom surface and the facing surface may be in the range of 30 to 500 micrometers, desirably in the range of 80 to 200 micrometers.

The liquid confinement structure 12 extends closer to the facing surface of the wafer W and wafer table WT than the last lens element 100. An immersion space 10 is therefore defined between the inner surface of the liquid confinement structure 12, the planar surface of the frustro-conical portion and the facing surface. During use, the immersion space 10 is filled with liquid. The liquid fills at least part of a buffer space between the complementary surfaces between lens and the liquid confinement structure 12, in an embodiment at least part of the immersion space 10 between the complementary inner-surface and the conical surface.

Liquid is supplied to the immersion space 10 through an opening formed in the surface of the liquid confinement structure 12. The liquid may be supplied through a supply opening 20 in the inner-surface of the liquid confinement structure. Alternatively or additionally, the liquid is supplied from an under supply opening 23 formed in the undersurface of the liquid confinement structure 12. The under supply opening may surround the path of the projection beam and it may be formed of a series of openings in an array. The liquid is supplied to fill the immersion space 10 so that flow through the space under the projection system is laminar. The supply of liquid from the under supply opening 23 under the liquid confinement structure 12 additionally prevents the ingress of bubbles into the immersion space 10. This supply of liquid functions as a liquid seal.

The liquid may be recovered from a recovery opening 21 formed in the inner-surface. The recovery of the liquid through the recovery opening 21 may be by application of an under pressure; the recovery through the recovery opening 21 as a consequence of the velocity of the liquid flow through the space; or the recovery may be as a consequence of both. The recovery opening 21 may be located on the opposite side of the supply opening 20, when viewed in plan. Additionally or alternatively, the liquid may be recovered through an overflow opening 24 located on the top surface of the liquid confinement structure 12, as shown in the right-hand arrangement. Note that if present the overflow may extend around the top of the liquid confinement structure, around the path of the projection beam.

Additionally or alternatively, liquid may be recovered from under the liquid confinement structure 12 through a bottom recovery opening 25, 32. A meniscus 33 forms between the liquid confinement structure 12 and the facing surface and it serves as border between the liquid space and the gaseous external environment. The bottom recovery opening may be a porous plate 25 which may recover the liquid in a single phase flow. The meniscus may be free to move over the surface of the porous plate during relative movement of facing surface relative to the liquid confinement structure. Alternatively, the bottom recovery opening 25, may serve to hold (or 'pin') the liquid meniscus 33 to the liquid confinement structure 12. The bottom recovery opening may be a series of pining openings 32 through which the liquid is recovered. The pining openings 32 may recover the liquid in a two phase flow.

Optionally radially outward, with respect to the innersurface of the liquid confinement structure 12, is an gas knife opening 26. Gas may be supplied through the gas knife opening 26 at elevated speed to assist confinement of the immersion liquid in the immersion space 12. The supplied gas may be humidified and it may contain carbon dioxide. The supplied gas may consist essentially of carbon dioxide and water vapor. Radially outward of the gas knife opening 26 is a gas recovery opening 18 for recovering the gas supplied through the gas knife opening 26.

FIG. 3 depicts two further arrangements of liquid confinement structure 12. The two different arrangements are shown for features on the bottom left-hand-side and bottom right-hand side of the figure, respectively. Unless mentioned otherwise, the two designs share common features. Features of the two arrangements shown in FIG. 3 which are common to FIG. 2 share the same reference numbers. The liquid confinement structure 12 has an inner surface which complements the conical surface of the frustro-conical shape. The undersurface of the liquid confinement structure 12 is closer to the facing surface than the bottom planar surface of the frustro-conical shape.

Liquid is supplied to the immersion space 10 through supply openings formed in the inner surface of the liquid confinement structure 12. The supply openings 34 are located towards the bottom of the inner surface, perhaps below the bottom surface of the fustro-conical shape. The supply openings 34 are located on an inner surface, spaced apart around the path of the projection beam.

Liquid is recovered from the immersion space 10 through recovery openings 25 in the undersurface of the liquid confinement structure 12. As the facing surface moves under the liquid confinement structure 12, the meniscus 33 may migrate over the surface of the recovery opening 25 in the same direction as the movement of the facing surface. The recovery openings 25 may be formed of a porous member. The liquid may be recovered in single phase. In an embodiment the liquid is recovered in a two phase flow. The two phase flow is received in a chamber 35 within the liquid confinement structure 12 where it is separated into liquid and gas. The liquid and gas are recovered through separate channels 36, 38 from the chamber 35.

An inner periphery 39 of the undersurface of the liquid confinement structure 12 extends into the space away from the inner surface to form a plate 40. The inner periphery forms a small aperture which may be sized to match the shape and size of the projection beam. The plate may serve to isolate liquid either side of it. The supplied liquid flows inwards towards the aperture, through the inner aperture and then under the plate radially outwardly towards the surrounding recovery openings 25.

In an embodiment the liquid confinement structure 12 may be in two parts: an inner part 12a and an outer part 12b. For convenience this arrangement is shown in the right-hand part of FIG. 3. The two parts may move relatively to each other, in a plane parallel to facing surface. The inner part may have the supply openings 34 and it may have the overflow recovery 24. The outer part 12b may have the plate 40 and the recovery opening 25. The inner part may have an intermediate recovery 42 for recovering liquid which flows between the two parts.

During exposure of a substrate, energy from the radiation beam B is absorbed by the substrate leading to local heating and thermal distortion of the substrate. There are various difficulties in predicting the effect on overlay of such local heating which stem from difficulties in predicting both temperature changes and the resulting distortion of the substrate. The known thermal test wafer provides some information on temperature changes that occur during exposures but the present inventors have determined that this information is insufficient to support desired improvements in overlay motivated by desired reductions in the size of features imaged on substrates. The information obtainable by the existing wafer provides a dataset insufficient in at least one of accuracy and resolution. Customer requirements of lithographic processes mean that tools have ever increasing specification in performance such as in overlay. Diagnostic tools to facilitate achieving these improved specifications are therefore desirable.

The present invention therefore proposes a measurement substrate for use in an apparatus for processing substrates, e.g. a lithographic apparatus, and having an improved architecture. The measurement substrate has a body, having dimensions compatible with the apparatus, in which are embedded a plurality of sensor modules and a central control module. Each sensor module comprises an analog sensor and an analog to digital converter. The analog to digital converter generates digital measurement information from analog measurement signals output by the sensor. The digital measurement information is output by a module controller in each sensor module to the central control module for output to an external device. By performing analog to digital conversion locally in each sensor module, the digital measurement information can be obtained without noise that would otherwise be picked up in long communication lines between dispersed sensors and a central controller. In the substrate stage of a lithographic apparatus a source of noise is the high levels of electromagnetic noise generated by the powerful electromagnetic motors required to accelerate the substrate support apparatus 60 during exposures.

In an embodiment, a storage device is included in each sensor module for local storage of the digital measurement information. The storage device can be a simple register. Such a register can allow multiple sensor modules to make simultaneous measurements which are then asynchronously transferred to the central control module. The storage device can be a larger memory, e.g. a non-volatile memory such as NAND flash memory or a volatile memory such as DRAM, that can store a plurality of measurements. A larger memory can allow all measurements obtained during a test process in a lithographic apparatus to be retained in the sensor module. The measurements can be transferred from the memory to the central control module when the measurement substrate is in an environment without, or away from, high levels of electromagnetic noise.

In an embodiment, a storage device is additionally or alternatively included in the central control module. A storage device in the central control module can be configured to store measurement information relating to many measurements by many sensors. Using a single storage device in the central control module, the manufacturing cost may be lower than that of provision of separate storage devices in each sensor module.

In an embodiment, an amplifier, e.g. an op-amp, is provided in each sensor module to amplify the analog measurement signal prior to analog to digital conversion. An amplifier can increase the sensitivity and/or the dynamic range of the measurement.

The measurement substrate of the present invention provides an architecture that is useful with various different types of sensor. In an embodiment the sensor is a temperature sensor. A temperature sensor allows a direct measurement of any temperature fluctuations of the substrate during a process carried out by the apparatus. In an embodiment, the temperature sensor is a bipolar transistor. A bipolar transistor can be formed in or on the body and so directly measure the temperature of the body itself. A bipolar transistor is a small and accurate device so that highly localized measurements can be obtained.

In an embodiment the temperature sensor is a negative temperature coefficient sensor. A negative temperature coefficient sensor cannot be formed directly in the body but must be fixed to it. There will therefore be some thermal resistance between a negative temperature coefficient sensor and the body. The resulting temperature measurement is either inaccurate or requires more time for a measurement to be made. The error or delay occurs because the negative temperature coefficient sensor and the substrate should to come into thermal equilibrium for a relatively accurate measurement.

In an embodiment, the sensor is a strain sensor which allows for direct measurement of the strain experienced by the substrate. Such a strain sensor avoids any possible inaccuracies in predicting thermal expansion from temperature changes. The strain sensor can be a resistive strain sensor whose resistance changes in response to applied strain. Resistive strain sensors are well known and highly accurate. The strain sensor can be a bipolar transistor. Bipolar transistors are inherently sensitive to both temperature and strain but can be designed to be insensitive to strain. A combination of a bipolar transistor that is sensitive to both temperature and strain and a bipolar transistor that is sensitive to temperature only can be used to isolate the effects of strain from those of temperature. The same advantages as indicated above for bipolar transistors as temperature sensors apply to bipolar transistors as strain sensors.

In an embodiment, the sensor is a temperature-sensitive resistor, e.g. a thermistor, which is embedded in the body of the measurement substrate. A thermistor can provide a temperature resolution of about 100 µK in a measurement time of 100 ms. A thermistor may be formed of silicided polysilicon and have a temperature coefficient of about 0.3%/K. Thermistors can be arranged in a Wheatstone bridge with reference resistors of the same nominal resistance to achieve a resolution of about 100 µK.

In an embodiment, two strain sensors are provided in each sensor module so as to measure strain in two orthogonal directions parallel to the major surface of the measurement substrate (e.g. X and Y directions of a lithographic apparatus).

In an embodiment, a sensor module comprises both a temperature sensor and a strain sensor. Having both types of sensor in a sensor module allows the relationship between temperature and strain to be directly measured and can be used to calibrate a model of temperature-induced strain in a substrate. It is also possible to separate mechanically-induced strain from thermally induced strain.

An embodiment of the invention is a method of measuring conditions in an apparatus for processing production substrates. A measurement substrate having dimensions compatible with production substrates is loaded into the apparatus. The measurement substrate has a central control module and plurality of sensor modules embedded therein, each sensor module comprising a sensor and an analog to digital converter. The sensor is operated to generate an analog measurement signal and the analog to digital converter converts the analog measurement signal to digital measurement information. The digital measurement information is transferred to the central control module and output from the central control module to an external device. This method allows the digital measurement information to be obtained without interference from electromagnetic noise due to the local analog to digital conversion, which avoids the need for long communication paths.

The method of the invention can be used in a lithographic apparatus, which operates to perform at least part of a process normally carried out on production substrates whilst the measurements are made, to directly measure temperature changes during the process. A plurality of measurements can be taken during the process so as to measure temperature or other conditions in time and space.

Figure 4:
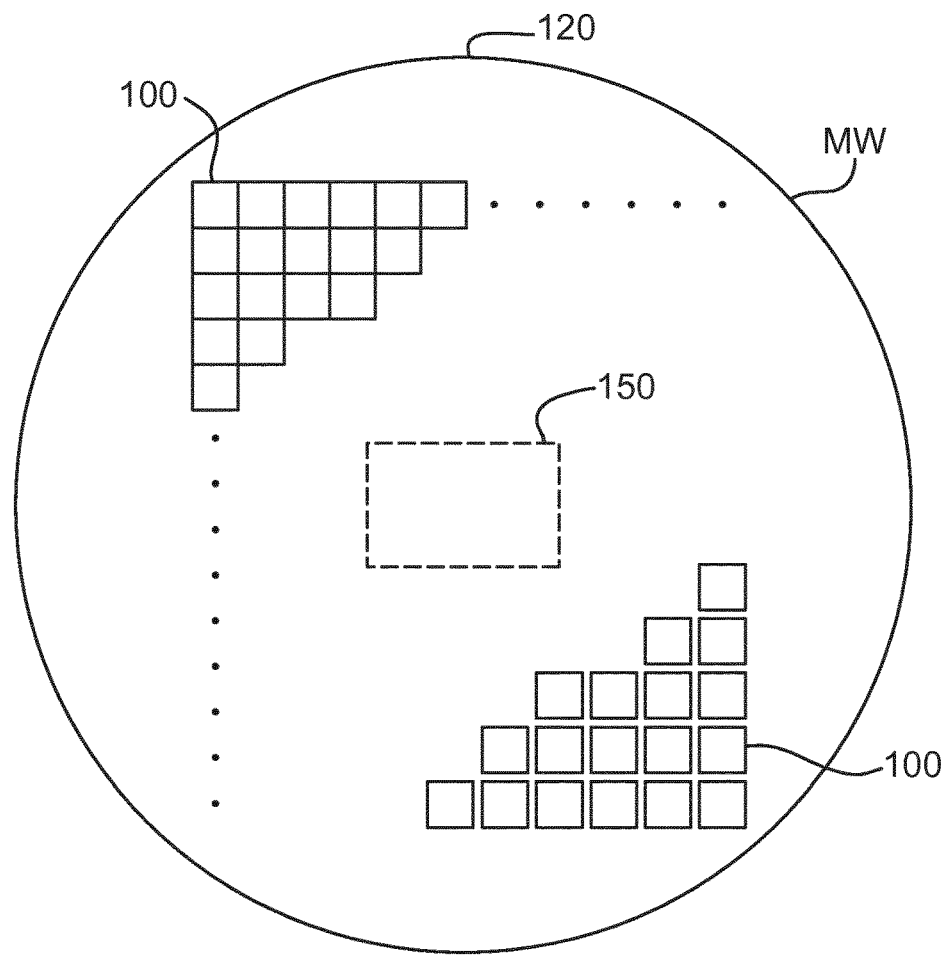
FIG. 4 depicts a measurement substrate according to an embodiment.

FIG. 4 depicts a measurement substrate MW according to an embodiment of the present invention. Measurement substrate MW comprises a body 120 which is compatible with a lithographic apparatus. For example, the body may be substantially circular, planar body with a diameter of 300 mm. The body can meet standard specifications for thickness and flatness of a production substrate, so that it can be loaded into and processed as if it were a standard process substrate. Measurement substrate MW is desirably resistant to immersion liquid and to the projection beam. Measurement substrate MW can be provided with a planarization layer across its entire top surface to provide resistance to immersion liquid. The planarization layer can help to ensure the measurement substrate meets flatness specifications of a process substrate.

Formed or embedded in body 120 are a plurality of sensor modules 100. Sensor modules 100 may be arranged in a grid (or 2-dimensional array) and may abut or be spaced apart or a combination of both. Desirably sensor modules 100 are disposed across substantially the entire area of body 120. Sensor modules 120 may have dimensions parallel to the surface of body 120 of less than 5 mm, e.g. about 1 mm.

In an embodiment, the substrate has many sensors distributed all over the wafer. Specific sensors can be selected for measurement of a parameter related to a particular application. The distribution of the sensor array can be designed to suit a specific measurement. As such when the sensor module 100 is selected to be in operation selected other sensor modules may be switched off. Different number of sensors and sensors at specific locations over the sensing substrate can be selected for various reasons which possibly include (in a non-limited list): matching the sensor positions to match a features of a particular surface, minimizing heat generated by the measurement substrate, focusing on specific parts of a surface, enabling redundancy in the event of sensor failure, optimizing the resolution and accuracy of the sensing wafer for a specific application or experiment, etc.

For example, the selected sensors could be selected to match the features of an operating component of the tool such as an immersion footprint of a liquid confinement structure. The sensors could be selected only over a limited surface of the measurement substrate, such as at the edge of the measurement substrate. Such an arrangement could be suited for measuring the temperature at the substrate edge during operation which, in immersion tool, would experience intermittent fluid flow when fluid is recovered through the table at the substrate edge. By minimizing or optimizing the operable sensors, as sensors generate heat, the heat generated through operation of the measurement substrate is limited to those components necessary for a thermal measurement.

In having selectable sensor modules distributed over the surface of a measurement substrate MW, the number of sensors per unit area, i.e. the density of sensors, can be varied and therefore so can the resolution. Selectable sensors therefore enable the resolution of the measurement substrate to be varied according to the application of the measurement substrate. In having an array of selectable sensors, a single measurement substrate may be adapted for different uses, without recourse in having to develop different measurement substrates for different uses.

Alternatively, all sensors may be in operation during a measurement process, but only the data from selected sensors is downloaded or used for analysis.

In an embodiment, body 120 is a silicon substrate and sensor modules 100 are formed directly in an upper surface of body 120 by a standard CMOS process. A central control module 150 controls the overall operation of the measurement substrate. Although depicted as larger than a sensor module 120 it can be smaller and located anywhere. Similarly, although depicted as located in the center of body 120 and referred to as "central" it can be located at any convenient location of body 120. Central control module 150 can be located on the opposite surface of the body from the sensor modules.

Figure 5:
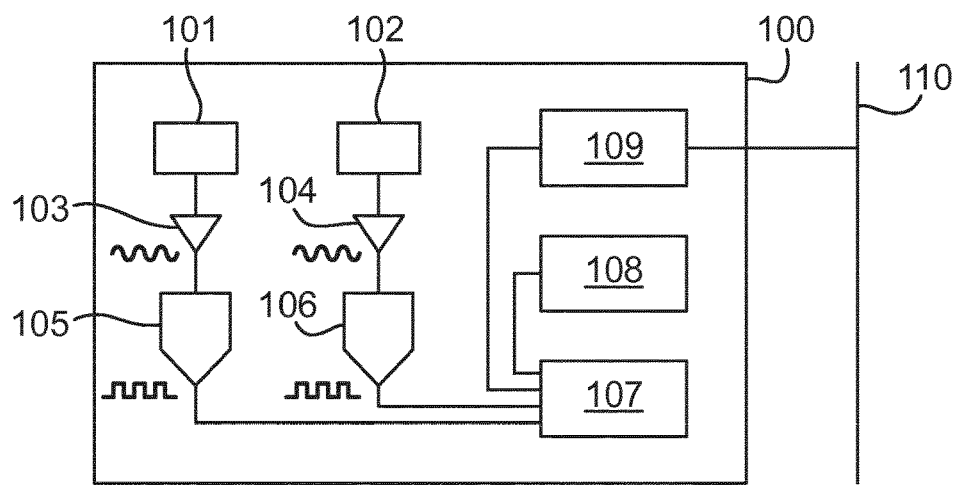
FIG. 5 depicts a sensor module of a measurement substrate according to an embodiment.

FIG. 5 depicts in more detail a sensor module 100. Sensor module 100 includes a first sensor 101 and second sensor 102. First sensor 101 may be a temperature sensor. Second sensor 102 may be a strain sensor. Other forms of sensor are possible. Sensor module 100 may include only one sensor. Sensor module 100 may include more than two sensors. A switch (not shown) may be provided to enable activation or deactivation of the sensor module 100.

First sensor 101 and second sensor 102 output an analog measurement signal. The first and second sensors are connected to respective amplifiers 103, 104. Amplifiers 103, 104 amplify the respective analog measurement signals. Amplifiers 103, 104 are desirably as close as possible to first sensor 101 and second sensor 102 so that minimum noise is picked up before amplification, Amplifiers 103, 104 may be op-amps.

Analog to digital converters 105, 106 receive the amplified analog measurement signals from amplifiers 103, 104 and generate digital measurement information therefrom. Desirably analog to digital converters 105, 106 are located as close as possible to amplifiers 103, 104 to minimize the amount of noise that is picked up before analog to digital conversion.

A module controller 107 receives the digital measurement information from analog to digital converters 105, 106 and directs it to storage device 108. Module controller can be a programmable micro-controller of any convenient type. Storage device 108 can be a non-volatile memory, such as NAND flash, or a volatile memory, such as DRAM or SRAM. In a read-out mode, module controller 107 reads out digital measurement information from storage device 108 and provides it to module interface 109 for transmission to data bus 110. Error detection and/or correction codes can be added to the digital measurement information before it is transmitted. Sensor module 100 can operate in an immediate readout mode in which each measurement that is made is directly output onto data bus 110. In such a mode storage device 108 may be a simple register. Sensor module 100 can operate in a batch readout mode in which measurements are collected into batches that are output onto data bus 110 after a delay, e.g. in response to a polling request. In such a mode storage device 108 desirably has capacity to store multiple batches of measurements.

In an embodiment, sensors 101, 102 make measurements at a sampling rate in the range of from 1 to 100 Hz. Measurements at a lower rate than 1 Hz can also be made, e.g. to monitor long-term stability of a component of the lithographic apparatus. After analog to digital conversion, each measurement may require only a single byte or may require a few bytes if stored with metadata, such as error detection and/or correction codes, a time stamp and a sensor identifier. Hence, it will be seen that storage device 108 need at most have a capacity of a few tens or hundreds of kilobytes.

All of the components making up sensor module 100 can readily be manufactured in the body with conventional techniques, e.g. a CMOS process.

Data bus 110 can be a serial bus or a parallel bus in a ring or hub and spoke arrangement. To minimize the number of wiring layers above the sensors, the data bus can be formed on the underside of body 120 and connected to the sensor modules by through-substrate vias.

Figure 6:
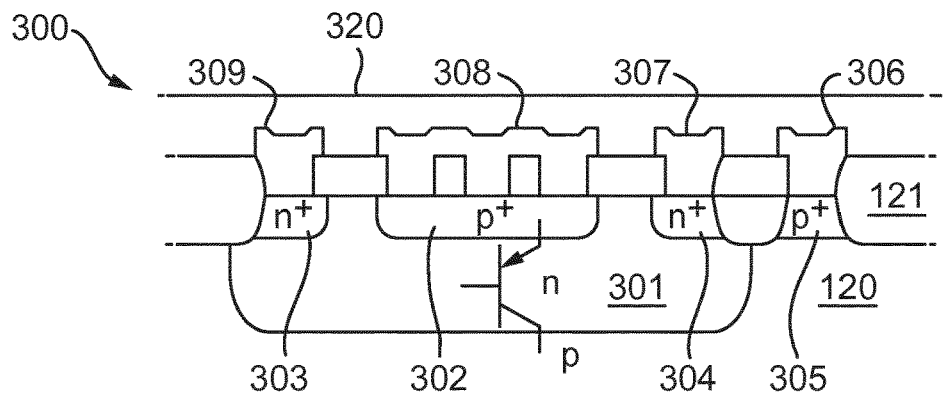
FIG. 6 depicts a sensor of a measurement substrate according to an embodiment.

FIG. 6 depicts a bipolar transistor 300, which may also be referred to as a bipolar junction transistor, usable as a temperature and/or strain sensor in an embodiment of the invention. FIG. 6 exaggerates the vertical scale: parts of the devices that are formed above the original surface of the body are very thin. Nevertheless a planarization layer 320 may be provided above the bipolar transistor 300 to ensure the upper surface of the measurement substrate meets desired flatness criteria.

Bipolar transistor 300 is of the substrate type and comprises an n-doped well 301 which is formed in body 120 which is p-type. An emitter region 302 is formed as a p+ region within n-doped well 301. The base is formed by n+ regions 303, 304 at the boundaries of n-doped well 301 and the source/collector is formed by a p+ region 305 adjacent but insulated from n+ region 304. Connections to the emitter base and source/collector regions can be made through holes in surface oxide layer 121 by Al conductors 306-309. The forward voltage of bipolar transistor 300 is proportional to temperature and can be measured by known circuitry to enable a temperature measurement of resolution about 1 to 10 mK.

Figure 7:
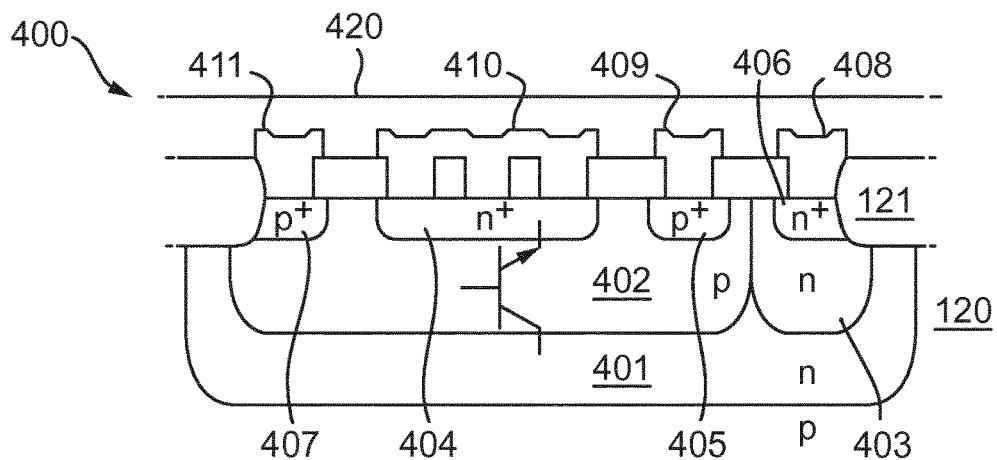
FIG. 7 depicts another sensor of a measurement substrate according to an embodiment.

A bipolar transistor is advantageous in measuring the temperature of the body directly, without intervening thermal resistance as occurs with a negative temperature coefficient sensor. A bipolar transistor can also provide a resolution about 10 times better than a negative temperature coefficient temperature sensor for the same power consumption. The bipolar transistor may be advantageous because a higher density of bipolar sensors may be present on the body of the measurement substrate than could achieved using negative temperature coefficient sensors. Therefore, despite bipolar transistors having generally poorer precision than negative temperature coefficient sensors, a higher resolution may be achieved. In using a greater number of sensors per unit area, the accuracy of a temperature measurement may also improve FIG. 7 depicts a bipolar transistor 400 of the vertical NPN type that can also be used as a temperature and/or strain sensor in an embodiment of the invention. FIG. 7 exaggerates the vertical scale: parts of the devices that are formed above the original surface of the body are very thin. Nevertheless a planarization layer 420 may be provided above the bipolar transistor 400 to ensure the upper surface of the measurement substrate meets desired flatness criteria.

Bipolar transistor 400 comprises an n-doped deep well 401 which is formed in body 120 which is p-type. A p-doped well 402 and an n-doped well 403 are formed within n-doped deep well 401. An emitter region 404 is formed as an n+ region within p-doped well 402. The base is formed by p+ regions 405, 407 at the boundaries of p-doped well 402 and the source/collector is formed by an n+ region 406 within n-doped well 403. Connections to the emitter base and source/collector regions can be made through holes in the oxide layer 121 by Al conductors 408 to 411. The forward voltage of bipolar transistor 400 is proportional to temperature and can be measured by known circuitry to enable a temperature measurement of resolution about 1 to 10 mK.

Figure 8:
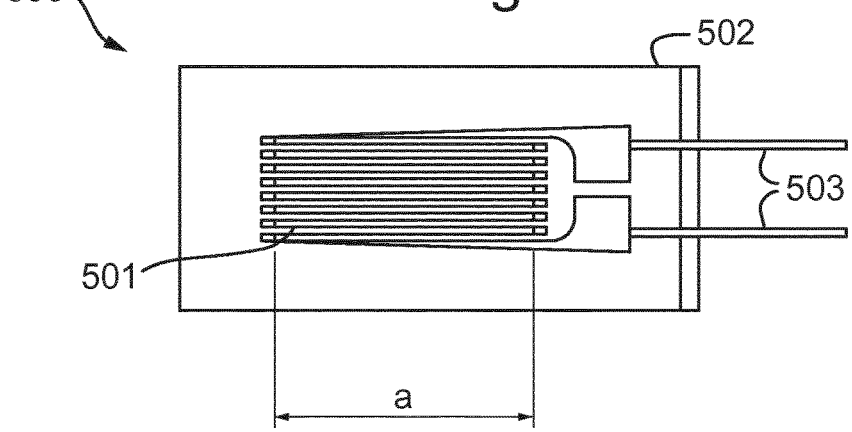
FIG. 8 depicts another sensor of a measurement substrate according to an embodiment.

A foil strain gauge 500 usable as sensor 101 or 102 is depicted in FIG. 8. Such a sensor is an example of a strain sensor which may be used in the measurement substrate MW. Foil strain gauge 500 comprises a wire 501 laid out in a zig-zag arrangement with multiple parallel lengths aligned in the direction in which strain is to be measured. The wire 501 is encapsulated in a foil package which is adhered to the surface of the body 120. Any deformation of the body 120 will cause the length a of the zig-zag arrangement to change, e.g. increase. The change in length a is multiplied by the number of parallel lengths of the wire to give the total change in length of wire 501 so that a measurable change in resistance of wire 501 occurs. Terminals 503 are connected to the sensor module.

Foil strain gauge 500 may have a thickness of about 50 µm and an area of about 50 mm². Thus a foil strain gauge is likely much larger than a sensor module using bipolar transistors as sensors so that strain is measured at a lower resolution than temperature.

A measurement substrate according to an embodiment of the present invention can also be provided with both one or more imaging devices and one or more pressure sensors, as described in EP application 15177120.1 filed on 15 Jul. 2015 which is hereby incorporated by reference in its entirety. Other relevant forms of sensors can be included.

Figure 9:
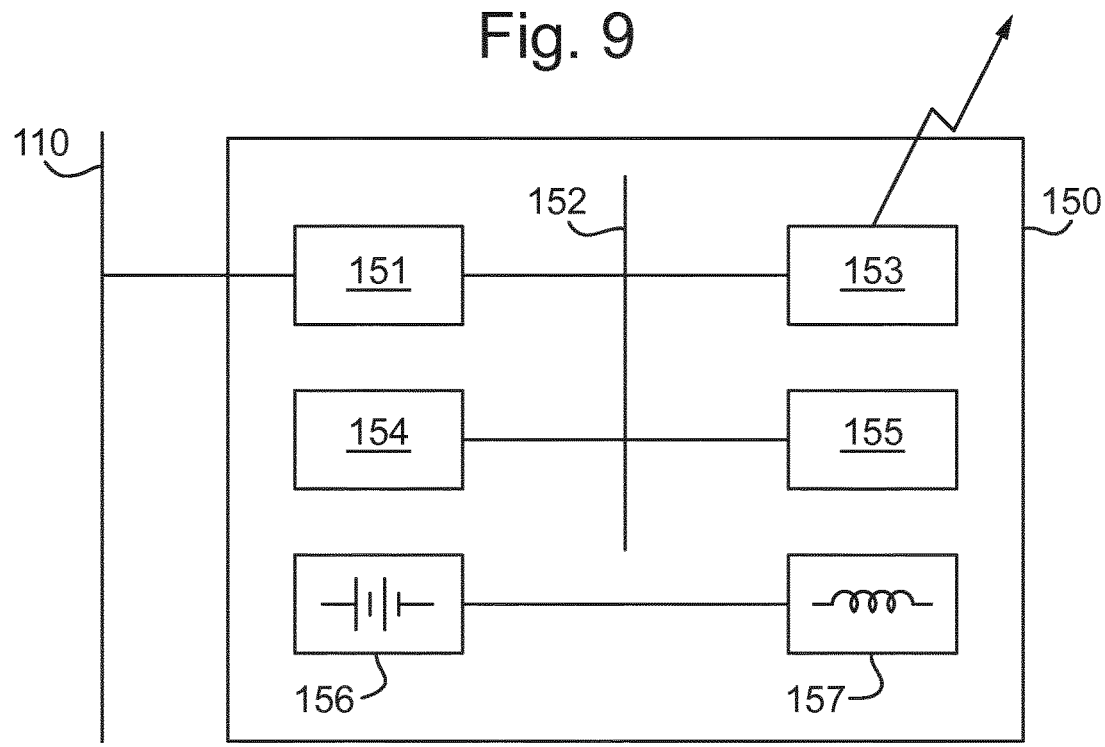
FIG. 9 depicts a central control module of a measurement substrate according to an embodiment.

FIG. 9 depicts in more detail the central control module 150 which is embedded in body 120, e.g. manufactured directly into the substrate using a CMOS process. Central control module 150 can be located on the opposite side of body 120 than the sensor modules 100. In an embodiment central control module may be small enough that it can be located within an array of sensor modules 100 without disturbing the distribution of sensors in the array, for example in terms of the location of each sensor in a regular, periodic array.

Central control module 150 comprises an interface 151. The interface connects with data bus 110 and an internal bus 152. The internal bus 152 is also connected to a wireless communication module 153, a micro-controller 154 and storage device 155. Power is supplied by power storage device 156. Power storage device may be connected to inductive charging unit 157.

FIG. 11 depicts a method of use of the measurement substrate MW.

Measurement substrate MW is loaded 51 into the lithographic apparatus in exactly the same way as a resist-coated substrate is loaded for exposure. If desired, the measurement substrate MW can be coated with a photo-sensitive resist before loading into the lithographic apparatus. The photo-sensitive resist has no function in the method of the invention but is provided to make the conditions experienced by the measurement substrate as close as possible to those experienced by a production substrate. Measurement substrate MW is placed onto substrate table WT by a substrate handler.

Once loaded into the lithographic apparatus and placed on the substrate table WT, measurement substrate MW may be subjected to certain prequalification steps S2, e.g. flatness measurements, to validate the measurement substrate MW and verify that it will not damage the lithographic apparatus. However a complete pre-characterization process as normally performed for production substrates need not be applied. Desirably the same temperature conditioning process is performed on the measurement substrate as for a production substrate.

In a dual station lithographic apparatus the measurement substrate MW is transferred S3 to an exposure station ES. The measurement substrate starts taking and recording S4 measurements. A set of exposures S5 is performed as for a normal production substrate. The measurement substrate stops S6 taking measurements.

Figure 10:
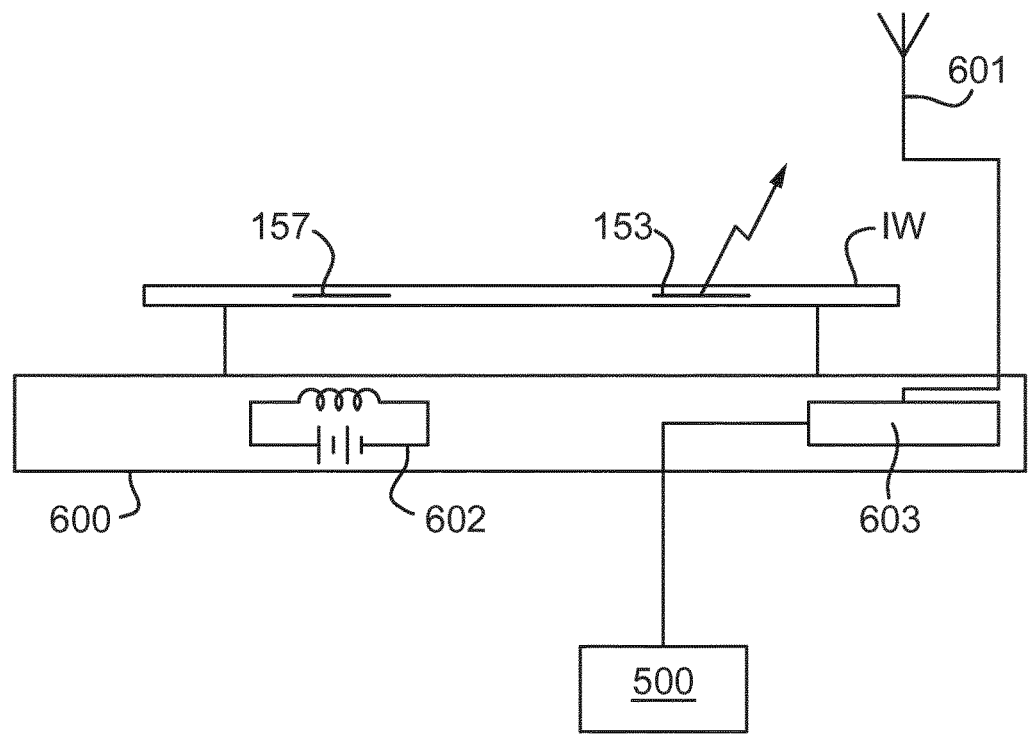
FIG. 10 depicts a measurement substrate according to an embodiment in a download station.

Once all desired measurements have been collected, measurement substrate MW is unloaded S7 from the apparatus in the same way as a production substrate. However rather than being sent to a track for processing, measurement substrate MW is transferred S8 to a download station 600, an embodiment of which is depicted in FIG. 10. At the download station 600 data of the stored measurements can be downloaded S9 from storage device 155 via interface 153. Interface 153 may connect to an interface 603 in the download station via a wireless communication technique, such as Wi-Fi (™) or Bluetooth (™) using serial 601. Power storage device 156 can be recharged at the download station, e.g. via a wireless induction charging system. Alternatively, the lower surface of measurement substrate MW can be provided with electrical contacts for both downloading of data of images and/or measurements from storage device 155 and for charging power storage device 156.

The downloaded data is then analyzed S10 to identify any faults or problems with the object that has been inspected. Analysis of the downloaded data can be manual, automatic or a combination of manual and automatic processes. Automatic analysis may include pattern recognition or comparison with reference data, In an embodiment of the present invention, the measurement substrate is used with a lithographic apparatus which has not been designed with the measurement substrate in mind so that no specific means are provided for the lithographic apparatus to communicate with or control the measurement substrate when it is in lithographic apparatus. Therefore, the measurement substrate desirably operates autonomously. In an embodiment of the present invention, the measurement substrate is configured to record measurements as soon as it is switched on prior to loading into the lithographic apparatus and continue until it is unloaded and connected to the download station 600. This may however require a storage device 155 with a large capacity or may require the sampling rate to be limited.

In an embodiment, the measurement substrate is programmed to record measurements for specific time periods which may be defined relative to an included clock or an initiating event. The time periods for measurement recording are predetermined to match the timings of a predetermined program of movements of the measurement substrate through the lithographic apparatus.

In an embodiment, the measurement substrate is configured to determine when it is correctly located to begin capturing measurements. Other sensors can be provided to enable the measurement substrate to determine its location within the lithographic apparatus.

In an embodiment, the lithographic apparatus is provided with a communication device for communicating with the measurement substrate when the measurement substrate is loaded on the substrate table. The communication means may be a wireless communication means, e.g. Wi-Fi (™) or Bluetooth (™) or a wired connection via the underside of the measurement substrate. If a wired connection can be provided, power may also be provided to the measurement substrate avoiding the need to provide a power storage device 156 in the measurement substrate. A communication device can be retrofitted to an existing lithographic apparatus.

If a communication device is provided in the lithographic apparatus it can be used to instruct the measurement substrate to begin capturing measurements and also to download captured measurement data. In an embodiment, data captured by the measurement substrate is downloaded and analyzed in parallel with the exposures. This allows remedial action to be carried out immediately a problem is detected.

Although the present invention has been described above in relation to use of the measurement substrate to measure conditions prevailing in a lithographic apparatus, the measurement substrate can also be used to measure conditions prevailing in another apparatus, such as a metrology apparatus. A measurement substrate according to an embodiment of the present invention can be used in a process device of the track, provided that the measurement substrate is capable of withstanding conditions prevailing in the track, e.g. high temperatures. A measurement substrate according to an embodiment can be used in a test bed or partial apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

In an embodiment there is a measurement substrate for measuring a condition pertaining in an apparatus for processing production substrates during operation thereof. The measurement substrate comprises: a body, a plurality of sensor modules and a central control module. The body has dimensions similar to that of a production substrate so that the measurement substrate is compatible with the apparatus. The plurality of sensor modules is in the body. Each sensor module comprises: a sensor configured to generate an analog measurement signal; an analog to digital converter configured to generate digital measurement information from the analog measurement signal; and a module controller configured to output the digital measurement information. The central control module is configured to receive the digital measurement information from each of the module controllers and to communicate the digital measurement information to an external device.

Each sensor module may further comprise a storage device configured to store the digital measurement information. Each sensor module may further comprise an amplifier configured to amplify the analog measurement signal. The central control module may further comprise a central storage device configured to store the digital measurement information. Each sensor module may further comprise an amplifier configured to amplify the analog measurement signal.

A sensor comprises a temperature sensor. The temperature sensor may comprise a bipolar transistor. The sensor may comprise a strain sensor. The strain sensor comprises a bipolar transistor. The strain sensor may comprise a resistive sensor.

A sensor module may comprise a first strain sensor configured to measure strain in a first direction and a second strain sensor configured to measure strain in a second direction. The second direction may be orthogonal to the first direction. The sensor module may comprise a temperature sensor and a strain sensor. The measurement substrate may comprise more than 100 sensor modules. The sensor may be embedded in the body.

In embodiment of the invention there is a method of measuring conditions in an apparatus for processing production substrates. The method comprises: loading, operating, using, transferring and outputting. In loading, a measurement substrate is loaded into the apparatus, the measurement substrate having dimensions similar to that of a production substrate so that the measurement substrate is compatible with the apparatus. The measurement substrate has a central control module and plurality of sensor modules. Each sensor module comprises a sensor and an analog to digital converter. In operating, the sensor is operated to generate an analog measurement signal. In using, the analog to digital converter is used to convert the analog measurement signal to digital measurement information. In transferring, the digital measurement information is transferred to the central control module. And in outputting, the digital measurement information is output from the central control module to an external device.

The apparatus may be a lithographic apparatus. The method may further comprise unloading the measurement substrate from the apparatus before the outputting. Operating the sensor may be performed whilst the apparatus performs at least a part of a process for processing substrates. The operating of the sensor may be performed a plurality of times during the part of a process for processing substrates.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A measurement substrate for measuring a condition pertaining in an apparatus for processing production substrates during operation thereof, the measurement substrate comprising:
   a body having dimensions similar to that of a production substrate so that the measurement substrate is compatible with the apparatus;
   a plurality of sensor modules in the body, the plurality of sensor modules arranged in a two-dimensional array, each sensor module comprising:
      a sensor configured to generate an analog measurement signal, the sensor comprising at least a temperature sensor or a strain sensor,
      an analog to digital converter configured to generate digital measurement information from the analog measurement signal, and
      a module controller configured to output the digital measurement information; and
   a central control module configured to receive the digital measurement information from each of the module controllers and to communicate the digital measurement information to an external device.

2. The measurement substrate according to claim 1, wherein each sensor module further comprises a storage device configured to store the digital measurement information.

3. The measurement substrate according to claim 1, wherein each sensor module further comprises an amplifier configured to amplify the analog measurement signal.

4. The measurement substrate according to claim 1, wherein the central control module further comprises a central storage device configured to store the digital measurement information.

5. The measurement substrate according to claim 1, wherein at least one of the sensor modules comprises at least the strain sensor and the strain sensor comprises at least a bipolar transistor or a resistive sensor.

6. The measurement substrate of claim 1, wherein at least one of the sensor modules comprises at least the temperature sensor and the temperature sensor comprises a bipolar transistor.

7. The measurement substrate according to claim 1, wherein at least one of the sensor modules comprises a first strain sensor configured to measure strain in a first direction and a second strain sensor configured to measure strain in a second direction, the second direction being orthogonal to the first direction.

8. The measurement substrate according to claim 1, wherein at least one of the sensor modules comprises a temperature sensor and a strain sensor.

9. The measurement substrate according to claim 1, comprising more than 100 of the sensor modules.

10. The measurement substrate according to claim 1, wherein the sensor of at least one of the sensor modules is embedded in the body.

11. The measurement substrate according to claim 1, further comprising a switch configured to cause one or more modules of the sensor modules to be de-activate while allowing one or more other sensor modules of the sensor modules to be active.

12. A method of measuring conditions in an apparatus for processing production substrates, the method comprising:
   loading into the apparatus a measurement substrate having dimensions similar to that of a production substrate so that the measurement substrate is compatible with the apparatus, the measurement substrate having a central control module and plurality of sensor modules, the plurality of sensor modules arranged in a two-dimensional array, each sensor module comprising a sensor and an analog to digital converter, the sensor comprising at least a temperature sensor or a strain sensor;
   operating at least one of the sensors to generate an analog measurement signal;
   using at least one of the analog to digital converters to convert the analog measurement signal to digital measurement information;
   transferring the digital measurement information to the central control module; and
   outputting the digital measurement information from the central control module to an external device.

13. The method according to claim 12, further comprising unloading the measurement substrate from the apparatus before the outputting.

14. The method according to claim 12, wherein operating at least one of the sensors is performed whilst the apparatus performs at least a part of a process for processing substrates.

15. The method according to claim 14, wherein operating at least one of the sensors is performed a plurality of times during the part of a process for processing substrates.

16. The method according to claim 12, wherein at least one of the sensor modules comprises at least the strain sensor and the strain sensor comprises at least a bipolar transistor or a resistive sensor.

17. The method according to claim 12, wherein at least one of the sensor modules comprises at least the temperature sensor and the temperature sensor comprises a bipolar transistor.

18. The method according to claim 12, wherein at least one of the sensor modules comprises a first strain sensor configured to measure strain in a first direction and a second strain sensor configured to measure strain in a second direction, the second direction being orthogonal to the first direction.

19. A measurement substrate for measuring a condition pertaining in an apparatus for processing production substrates during operation thereof, the measurement substrate comprising:
  a body having dimensions similar to that of a production substrate so that the measurement substrate is compatible with the apparatus;
  a plurality of sensor modules in the body, the plurality of sensor modules arranged in a two-dimensional array, each sensor module comprising:
    a sensor configured to generate an analog measurement signal, the sensor comprising at least a temperature sensor or a strain sensor,
    an analog to digital converter configured to generate digital measurement information from the analog measurement signal, and
    a module controller configured to output the digital measurement information;
  a central control module configured to receive the digital measurement information from each of the module controllers and to communicate the digital measurement information to an external device; and
  a switch configured to cause one or more sensor modules to be de-active while allowing one or more other sensor modules of the sensor modules to be active.

20. The measurement substrate according to claim 19, wherein each sensor module further comprises an amplifier configured to amplify the analog measurement signal.

21. A measurement substrate for measuring a condition pertaining in an apparatus for processing production substrates during operation thereof, the measurement substrate comprising:
  a body having dimensions similar to that of a production substrate so that the measurement substrate is compatible with the apparatus;
  a plurality of sensor modules in the body formed by a standard CMOS process, each sensor module comprising:
    a sensor configured to generate an analog measurement signal, the sensor comprising at least a temperature sensor or a strain sensor, wherein the sensor is embedded in the body,
    an analog to digital converter configured to generate digital measurement information from the analog measurement signal, and
    a module controller configured to output the digital measurement information; and
  a central control module configured to receive the digital measurement information from each of the module controllers and to communicate the digital measurement information to an external device.

* * * * *